United States Patent
Sim et al.

(10) Patent No.: US 10,739,811 B2
(45) Date of Patent: Aug. 11, 2020

(54) PHASE LOCKED LOOP USING DIRECT DIGITAL FREQUENCY SYNTHESIZER

(71) Applicant: POSTECH ACADEMY-INDUSTRY FOUNDATION, Pohang-si (KR)

(72) Inventors: Jae Yoon Sim, Pohang-si (KR); Hwa Suk Cho, Daejeon (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 16/474,524

(22) PCT Filed: Nov. 30, 2017

(86) PCT No.: PCT/KR2017/013868
§ 371 (c)(1),
(2) Date: Jun. 27, 2019

(87) PCT Pub. No.: WO2018/124506
PCT Pub. Date: Jul. 5, 2018

(65) Prior Publication Data
US 2020/0026323 A1    Jan. 23, 2020

(30) Foreign Application Priority Data

Dec. 29, 2016 (KR) .................. 10-2016-0182938

(51) Int. Cl.
*H03L 7/10* (2006.01)
*G06F 1/03* (2006.01)
(Continued)

(52) U.S. Cl.
CPC ............ *G06F 1/0321* (2013.01); *H03L 7/083* (2013.01); *H03L 7/0818* (2013.01); *H03L 7/1976* (2013.01); *H03L 2207/50* (2013.01)

(58) Field of Classification Search
CPC ........ H01L 2924/00; H01L 2924/0002; H03G 1/0029; H03H 11/1291; H03L 7/06–16
See application file for complete search history.

(56) References Cited

U.S. PATENT DOCUMENTS

| 9,236,873 B1* | 1/2016 | Buell .................... H03L 7/0992 |
| 2011/0221492 A1 | 9/2011 | Mactaggart |
| 2016/0373120 A1* | 12/2016 | Caffee .................... H03L 7/091 |

FOREIGN PATENT DOCUMENTS

| KR | 2009-066389 A | 6/2009 |
| KR | 2011-0063006 A | 6/2011 |

(Continued)

OTHER PUBLICATIONS

International Search Report of International Application No. PCT/KR2017/013868 dated Mar. 23, 2018.
(Continued)

*Primary Examiner* — Sibin Chen
(74) *Attorney, Agent, or Firm* — Morgan, Lewis & Bockius LLP (57) ABSTRACT

The present invention relates to a design technology of a phase locked loop (PLL) for generating an accurate clock frequency in a clock synchronization system.
The present invention suggests a new structure based on a hardware description language (HDL), and thus reduces a chip area of a frequency synthesizer while obtaining a wide frequency operation range.
Furthermore, since only the HDL is used, the entire frequency synthesizer becomes all-synthesizable, and auto layout (auto P&R) can be achieved through a tool, which makes it possible to reduce a design cost of a designer.

10 Claims, 10 Drawing Sheets

(51) Int. Cl.
    *H03L 7/081*     (2006.01)
    *H03L 7/083*     (2006.01)
    *H03L 7/197*     (2006.01)

(56) References Cited

FOREIGN PATENT DOCUMENTS

| | | | |
|---|---|---|---|
| KR | 10-2016-0069538 | * | 6/2016 |
| KR | 2016-0069538 A | | 6/2016 |

OTHER PUBLICATIONS

Written Opinion of International Application No. PCT/KR2017/013868 dated Mar. 23, 2018.

* cited by examiner

Ex.) N=4  $\qquad f_{OUT} = N \cdot f_{REF}$

Ex.) M = 3 bit, $f_{osc}$ = 1 GHz

| $f_{CODE}$ | $A_{OUT}[MSB]$ (MHZ) |
|---|---|
| 000 | 0 |
| 001 | 125 |
| 010 | 250 |
| 011 | 375 |
| 100 | 500 |
| 101 | 625 |
| 110 | 750 |
| 111 | 875 |

FIG.7B ex.) $f_{CODE,FRAC}$ = 0000···0000 ($\Delta f$ = 0, integer)
     $f_{CODE,FRAC}$ = 0100···0000 ($\Delta f$ = −1/4, fractional)

Fig. 7C

| 1/2¹ sign | 1/2² | 1/2³ | 1/2⁴ | 1/2⁵ | 1/2⁶ | 1/2⁷ | 1/2⁸ | 1/2⁹ | 1/2¹⁰ | 1/2¹¹ | 1/2¹² | 1/2¹³ | 1/2¹⁴ | $\Delta f$ | |
|---|---|---|---|---|---|---|---|---|---|---|---|---|---|---|---|
| \<----- $f_{CODE,FRAC}$ (14b) -----\> | | | | | | | | | | | | | | | |
| 0 | 0 | 0 | 0 | 0 | 0 | 0 | 0 | 0 | 0 | 0 | 0 | 0 | 0 | $-0$ | $+0$ |
| 0 | 1 | 0 | 0 | 0 | 0 | 0 | 0 | 0 | 0 | 0 | 0 | 0 | 0 | $-1/2^2$ | $-0.25$ |
| 0 | 0 | 1 | 1 | 0 | 0 | 0 | 0 | 0 | 0 | 0 | 0 | 0 | 0 | $-(1/2^3+1/2^4)$ | $-0.1875$ |
| 0 | 0 | 0 | 0 | 0 | 1 | 0 | 0 | 0 | 0 | 0 | 0 | 0 | 0 | $-1/2^6$ | $-0.015625$ |
| 1 | 0 | 0 | 0 | 0 | 0 | 0 | 0 | 0 | 0 | 0 | 0 | 0 | 0 | $1/2^1$ | $+0.5$ |
| 1 | 1 | 0 | 0 | 0 | 0 | 0 | 0 | 0 | 0 | 0 | 0 | 0 | 0 | $1/2^1 - 1/2^2$ | $+0.25$ |
| 1 | 0 | 1 | 1 | 0 | 0 | 0 | 0 | 0 | 0 | 0 | 0 | 0 | 0 | $1/2^1 - (1/2^3+1/2^4)$ | $+0.3125$ |
| 1 | 0 | 0 | 0 | 0 | 1 | 0 | 0 | 0 | 0 | 0 | 0 | 0 | 0 | $1/2^1 - (1/2^6)$ | $0.484375$ |

PHASE LOCKED LOOP USING DIRECT DIGITAL FREQUENCY SYNTHESIZER

TECHNICAL FIELD

The present disclosure relates to a phase locked loop (PLL) for generating a clock signal having a frequency required in a clock synchronization system, and more particularly, to a PLL using a PLDDS (Phase-Locked Direct Digital Synthesizer), which can reduce a chip area and a design cost by using the PLDDS.

BACKGROUND ART

An electronic device or communication device performs data communication in synchronization with a clock signal. Therefore, it is important to generate a clock signal having an accurate frequency and phase for high-speed data communication.

In general, a PLL is widely used to synthesize a frequency. The PLL may be roughly divided into two kinds of PLLs depending on a design method. One is an analog PLL based on an early analog design method, and the other is a digital PLL based on a digital design method.

Figure 1A:
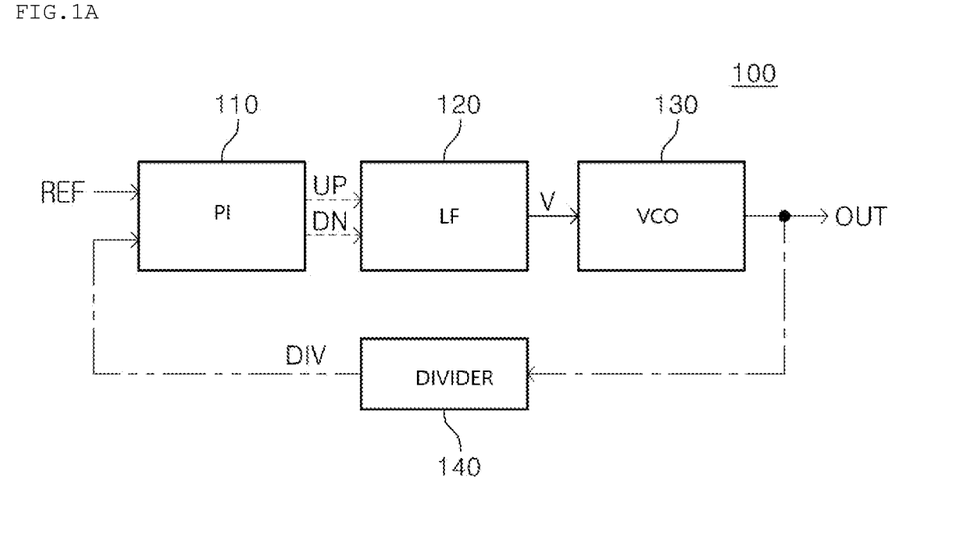
FIG. 1A is a block diagram of an analog phase locked loop (PLL) according to a related art.

FIG. 1A is a block diagram of an analog PLL according to a related art. As illustrated in FIG. 1A, the PLL 100 includes a PD (Phase Detector) 110, an LF (Loop Filter) 120, a VCO (Voltage-Controlled Oscillator) 130 and a divider 140.

Figure 1B:
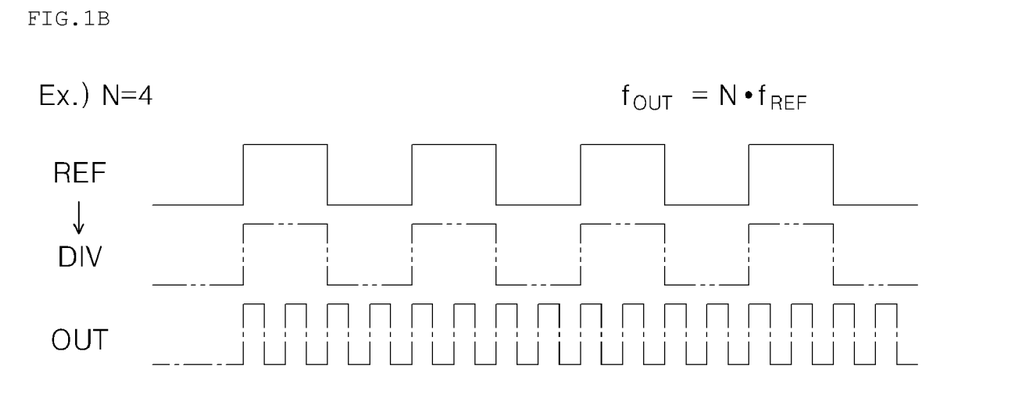
FIG. 1B is a waveform diagram of each unit in the PLL of FIG. 1A.

FIG. 1B is a waveform diagram of each unit in the PLL 100. Referring to FIG. 1B, an operation of the PLL 100 will be described as follows.

The PD 110 compares the phases of a reference clock signal REF and a divided signal DIV, and generates an error signal UP and DN based on a phase difference between the reference clock signal REF and the divided signal DIV. The LF 120 outputs a filtering voltage V by filtering the error signal UP and DN. The VCO 130 generates an output signal OUT having a frequency which is adjusted according to the filtering voltage V. The divider 140 generates the divided signal DIV by dividing the output signal OUT at a preset division ratio of 4, for example. The divider 140 may be implemented as a fractional-N divider or integer-N divider.

However, such an analog PLL is very sensitive to a PVT (Process, Voltage, Temperature) variation, has high power consumption, and occupies a large installation area.

In order to compensate for such a disadvantage, the digital PLL has been suggested.

Figure 2:
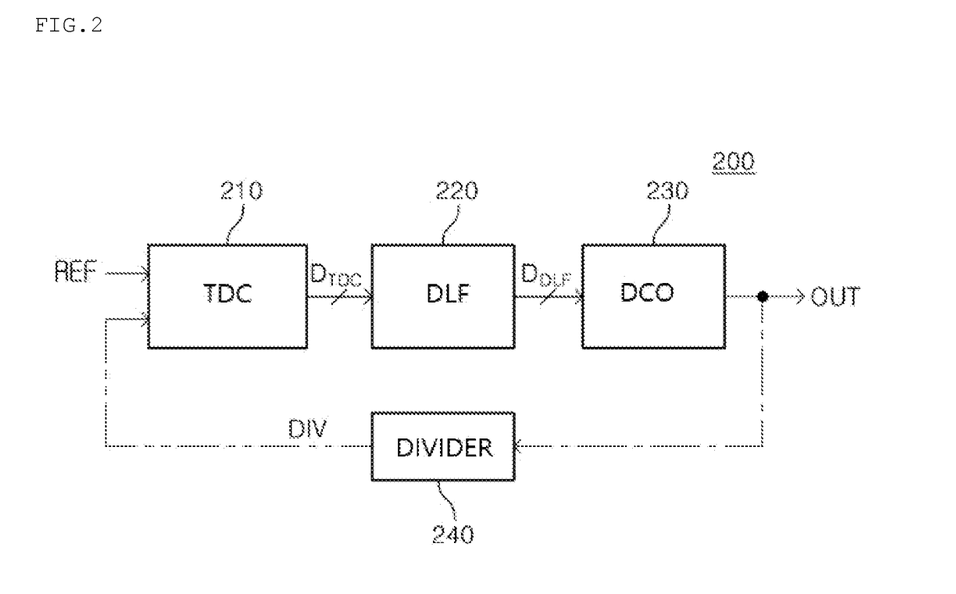
FIG. 2 is a block diagram of a digital PLL according to a related art.

FIG. 2 is a block diagram illustrating an ADPLL (All-Digital PLL) according to a related art. As illustrated in FIG. 2, the PLL 200 includes a TDC (Time to Digital Converter) 210, a DLF (Digital Loop Filter) 220, a DCO (Digitally Controlled Oscillator) 230 and a divider 240.

Like the analog PLL, the digital PLL requires phase comparison between the reference clock signal REF and the divided signal DIV. The analog PLL outputs a phase difference as a voltage or current. In the digital PLL, however, the TDC 210 converts a phase difference between the reference clock signal REF and the divided signal DIV, that is, a time difference into a digital code $D_{TDC}$, and outputs the digital code $D_{TDC}$.

The DLF 220 generates a digital code $D_{DLF}$ by filtering the digital code generated through the TDC 210 using an adder and a multiplexer.

The DCO 230 generates an output signal OUT whose phase and frequency are adjusted according to the digital code $D_{DLF}$ outputted from the DLF 220.

The divider 240 generates the divided signal DIV by dividing the output signal OUT. The divider 240 may be implemented as a fractional-N divider or integer-N divider.

Such a digital PLL 200 has an installation area and power consumption that are much smaller than the analog PLL 100, and is relatively insensitive to a PVT variation.

Recently, with the development of a semiconductor fabrication process, the unit lengths of semiconductor elements have gradually scaled down. The scale-down of the fabrication process has significantly improved the integration density and performance (speed and power consumption) of circuits, but exponentially increased the number of design rule constraints (DRC) that a designer needs to consider. Thus, as a design cost (effort and time) is rapidly increased, research is actively being conducted on an all-synthesizable circuit capable of significantly reducing the design cost by considerably shortening design and verification time.

The linearity and resolution of the DCO and the TDC which are used in the digital PLL decide the performance of a frequency synthesizer. Thus, the digital PLL needs to be verified through a mixed signal simulation. In this case, the digital PLL requires almost the same verification time and effort as the analog PLL. Therefore, the portability of design, which is an advantage of the digital design, may be limited to a specific portion.

DISCLOSURE

Technical Problem

Various embodiments are directed to an all-synthesizable frequency synthesizer capable of improving the portability of design even though a fabrication process of a phase locked loop (PLL) is changed to reduce a design cost based on design rules constraints (DRC) that a designer needs to consider with the scale-down of the fabrication process.

Technical Solution

In an embodiment, a PLL using a phase-locked direct digital synthesizer may include: a free-running oscillator configured to generate a free-running oscillation signal; a phase-locked direct digital synthesizer configured to generate an output clock signal and an output phase signal whose phases are locked, using the oscillation signal; and a phase interpolator configured to reduce out-of-band noise by processing the output clock signal.

The phase-locked direct digital synthesizer may include: a sampling D flip-flop configured to sample the output phase signal with a synchronization reference clock signal, and output a phase difference signal corresponding to a phase difference between the output clock signal and the synchronization reference clock signal; a digital loop filter configured to generate a first frequency code for adjusting the frequency of the output clock signal by filtering the phase difference signal; a rotational accumulator configured to accumulate a sum frequency code in each period of the oscillation signal through a modulus method, the sum frequency code corresponding to the sum of the first frequency code and a second frequency code, and output the most significant bit (MSB) of the accumulated output value as the output clock signal; a retimer configured to generate the synchronization reference clock signal synchronized with the oscillation signal by sampling the reference clock signal with the oscillation signal; and a coarse frequency lock configured to generate the second frequency code and output the second frequency code to an input side of the rotational accumulator, in order to prevent harmonic lock which occurs when the output clock signal is sub-sampled.

Advantageous Effects

In accordance with the embodiment of the present invention, the all-synthesizable frequency synthesizer may be designed to improve the portability of design even though the fabrication process of the PLL is changed, thereby reducing a design cost based on design rule constraints.

Furthermore, by suggesting a new structure based on a hardware description language (HDL), it is possible to reduce a chip area of the frequency synthesizer while obtaining a wide frequency operation range.

MODE FOR INVENTION

Hereafter, exemplary embodiments of the present invention will be described in detail with reference to the accompanying drawings.

Figure 3:
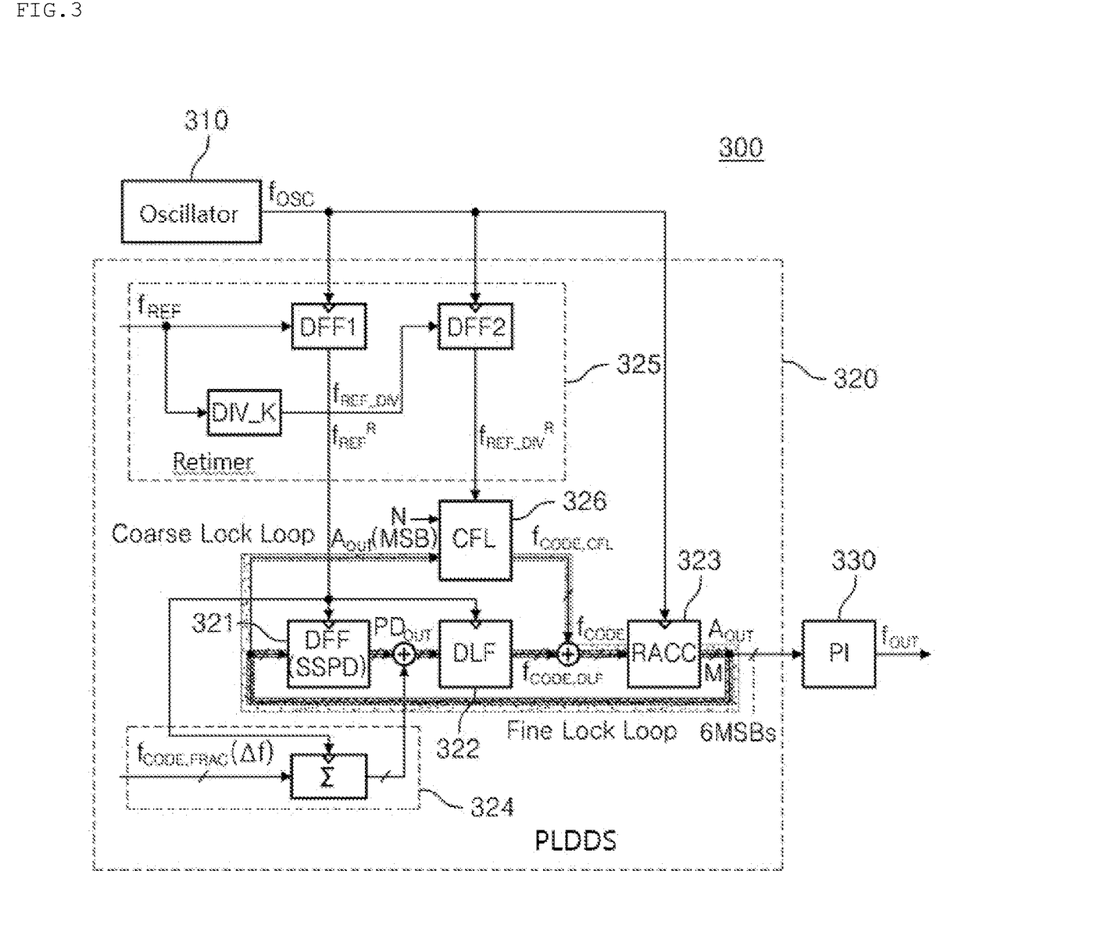
FIG. 3 is a block diagram of a PLL using a phase-locked direct digital synthesizer in accordance with an embodiment of the present invention.

FIG. 3 is a block diagram illustrating a phase locked loop (PLL) using a PLDDS (Phase-Locked Direct Digital Synthesizer) in accordance with an embodiment of the present invention. As illustrated in FIG. 3, the PLL 300 includes a free-running oscillator 310, a PLDDS 320 and a PI (Phase Interpolator) 330.

The free-running oscillator 310 generates an oscillation signal $f_{OSC}$ at a pre-designed frequency, in order to operate an RACC (Rotational Accumulator) 323.

The PLDDS 320 generates a low-noise digital output phase signal $A_{OUT}$ whose phase is locked, using the oscillation signal $f_{OSC}$ supplied from the oscillator 310. Hereafter, the low-noise digital output phase signal $A_{OUT}$ will be referred to as an 'output phase signal'.

For this operation, the PLDDS 320 includes a sampling D flip-flop 321, a DLF (Digital Loop Filter) 322, the RACC 323, a fractional accumulator 324, a retimer 325 and a CFL (Coarse Frequency Lock) 326.

Figure 4:
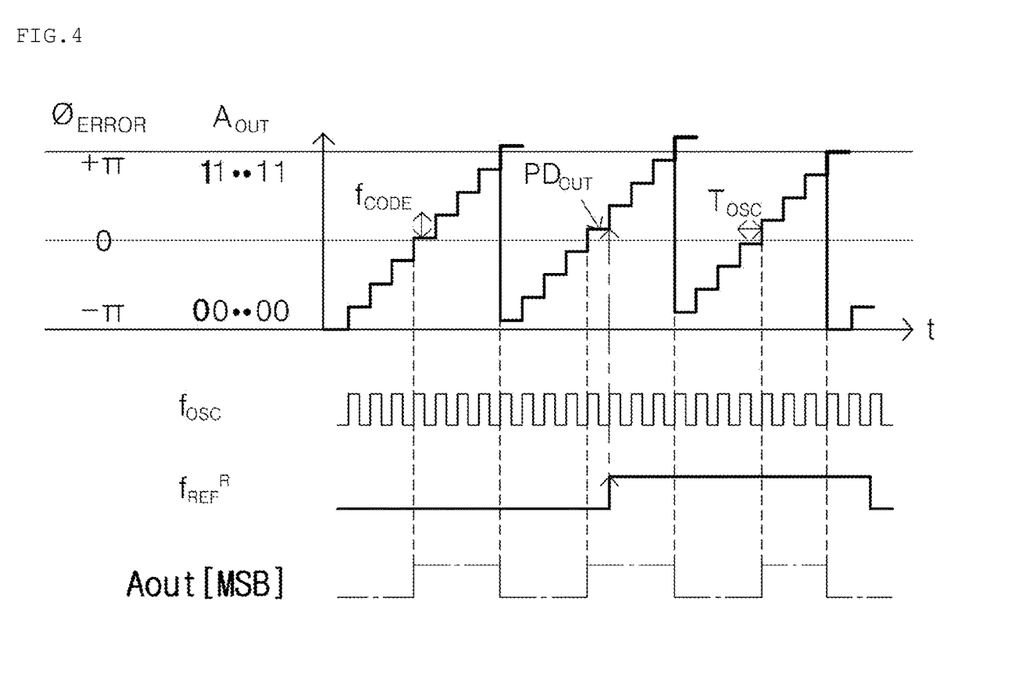
FIG. 4 illustrates the principle that a sampling D flip-flop extracts a phase using phase information of a digital code-based output phase signal.

In the PLDDS 320, the sampling D flip-flop 321, the DLF 322 and the RACC 323 form a fine lock loop, and the CFL 326 and the RACC 323 form a coarse lock loop. FIG. 4 illustrates the principle that the sampling D flip-flop 321 extracts a phase using phase information of a digital code-based output phase signal $A_{OUT}$.

Referring to FIG. 4, the sampling D flip-flop 321 extracts a phase difference signal $PD_{OUT}$ corresponding to a phase error by sampling the phase information of the output phase signal $A_{OUT}$ with a synchronization reference clock signal $f_{REF}^R$, the output phase signal $A_{OUT}$ being a digital output value outputted from the RACC 323. That is, the sampling D flip-flop 321 outputs the phase difference signal $PD_{OUT}$ corresponding to a phase difference between the output clock signal $A_{OUT}$[MSB] and the synchronization reference clock signal $f_{REF}^R$ by sampling the output phase signal $A_{OUT}$ with the synchronization reference clock signal $f_{REF}^R$. Therefore, the sampling D flip-flop 321 can perform the function of the TDC (Time to Digital Converter) 210 of FIG. 2.

The DLF 322 generates a first frequency code $f_{CODE,DLF}$ for adjusting the frequency of the output clock signal $A_{OUT}$[MSB] outputted from the RACC 323 by filtering the phase difference signal $PD_{OUT}$ supplied from the sampling D flip-flop 321.

The RACC 323 receives the oscillation signal $f_{OSC}$, and accumulates a sum frequency code $f_{CODE}$ in each period of the oscillation signal $f_{OSC}$, the sum frequency code $f_{CODE}$ corresponding to the sum of the first frequency code $f_{CODE,DLF}$ outputted from the DLF 322 and a second frequency code $f_{CODE,CFL}$ outputted from the CFL 326. When the RACC 323 is configured as an M-bit accumulator, the RACC 323 continuously accumulates digital input values through a modulus method, even though the accumulated value exceeds the maximum value ($2^M-1$). Thus, since the M bits outputted from the RACC 323 have periodicity, the RACC 323 may output the final output waveform of output phase signal $A_{OUT}$. The most significant bit (MSB) of the output phase signal $A_{OUT}$ is selected as the output waveform, and the output phase signal $A_{OUT}$ averagely has a frequency of $f_{CODE}/2^M \cdot f_{OSC}$. The other lower bits of the output phase signal $A_{OUT}$ represent digital phase information of the MSB waveform.

Figure 5A:
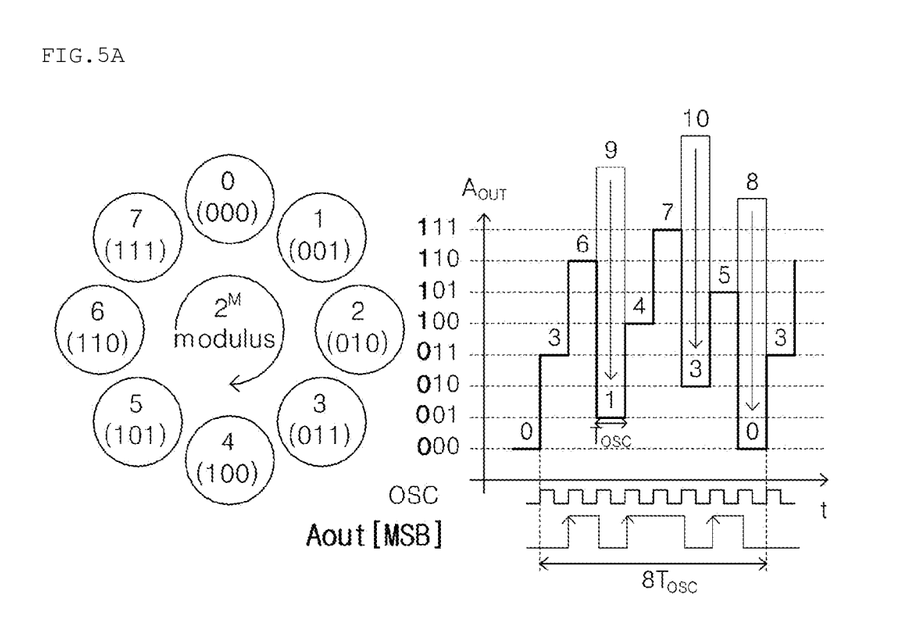
FIG. 5A is a diagram for describing the operation principle of a rotational accumulator.
Figure 5B:
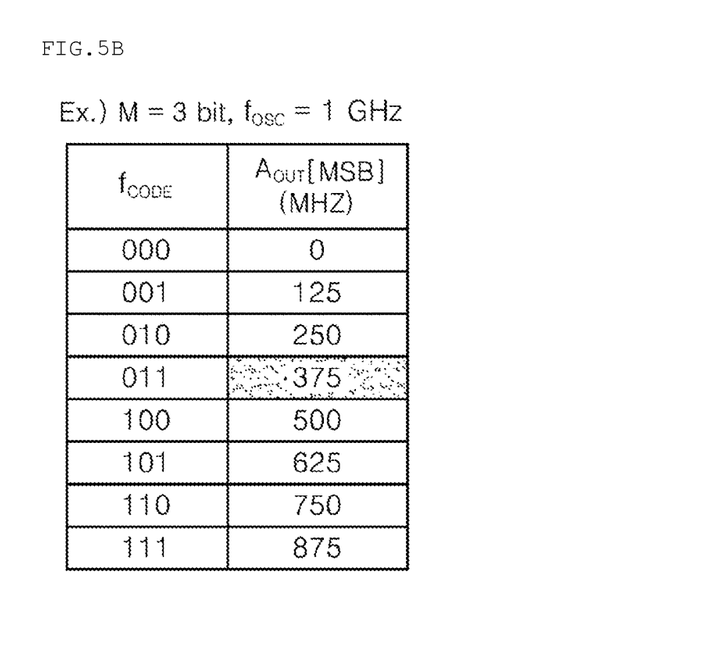
FIG. 5B is a table showing an output frequency of the rotational accumulator based on a frequency code.

Referring to FIGS. 5A and 5B, the operation of the RACC 323 that performs the function of the DCO (Digitally Controlled Oscillator) 230 of FIG. 2 will be described as follows. FIG. 5A is based on the supposition that the RACC 323 is configured as a three-bit accumulator and the value of the input sum frequency code $f_{CODE}$ is 3.

Referring to FIG. 5A, the RACC 323 accumulates the sum frequency code $f_{CODE}$ of 3 at each clock of the sum frequency code $f_{CODE}$, and outputs the output phase signal $A_{OUT}$ as a digital code of 0 (=3'b000), 3 (=3'b011) or 6 (=3'b110). The next digital code in the RACC 323 becomes 9, but becomes 1 (=3'b001) through a modulus operation. According to such a principle, digital codes are formed as a repeating pattern of 0, 3, 6, 1, 4, 7, 2, 5, 0, . . . in the RACC 323. The RACC 323 outputs the MSBs of the 3-bit digital codes having the above-described repeating pattern as the output clock signal $A_{OUT}$[MSB]. As a result, the RACC 323 generates three pulses for a time of $8T_{OSC}$. This indicates that the RACC 323 generates the output clock signal $A_{OUT}$ [MSB] having an average frequency of $3/(8T_{OSC})$. Therefore, the RACC 323 outputs the output clock signal $A_{OUT}$ [MSB] following an equation of $f_{CODE}/2^M \cdot f_{OSC}$ according to a digital control value referred to as the sum frequency code $f_{CODE}$.

FIG. 5B is a table showing the frequency of the output clock signal $A_{OUT}$[MSB] based on the sum frequency code $f_{CODE}$, when the frequency of the oscillation signal $f_{OSC}$ inputted to the RACC 323 is 1 GHz. When the output clock signal $A_{OUT}$[MSB] is generated as illustrated in FIG. 5A, the frequency of the output clock signal $A_{OUT}$[MSB] becomes 375 MHz.

As publicly known, phase information is obtained by integrating a frequency component. Therefore, since the RACC 323 integrates the sum frequency code $f_{CODE}$ indicating a frequency component and outputs the output clock signal $A_{OUT}$[MSB] according to the integration result, the output phase signal $A_{OUT}$ of the RACC 323 indicates phase information.

In the PLDDS 320, the RACC 323 directly receives the oscillation signal $f_{OSC}$ from the oscillator 310, and the sampling D flip-flop 321 receives the synchronization reference clock signal $f_{REF}^R$ from the retimer 325. However, since the two clock signals $f_{REF}^R$ and $f_{OSC}$ have completely independent frequencies, the PLDDS 320 requires a process of synchronizing the two clock signals as one clock signal in order to synthesize the two clock signals. For this operation, a D flip-flop DFF1 of the retimer 325 generates the synchronization reference clock signal $f_{REF}^R$ synchronized with the oscillation signal $f_{OSC}$ by sampling a reference clock signal $f_{REF}$ based on the oscillation signal $f_{OSC}$.

The PLDDS 320 requires two loops for locking the phase of the output clock signal $A_{OUT}$[MSB]. One of the two loops is the coarse lock loop, and the other is the fine lock loop. The PLL 300 detects a phase by directly sampling the output phase signal $A_{OUT}$ which does not pass through the divider. In this case, the PLDDS 320 requires the CFL 326 to prevent harmonic lock which occurs when the output phase signal $A_{OUT}$ is sub-sampled.

The CFL 326 includes a counter and a logic circuit, and outputs the second frequency code $f_{CODE,CFL}$ to an input side of the RACC 323 in order to prevent harmonic lock which occurs when the output clock signal $A_{OUT}$[MSB] is sub-sampled.

Figure 6A:
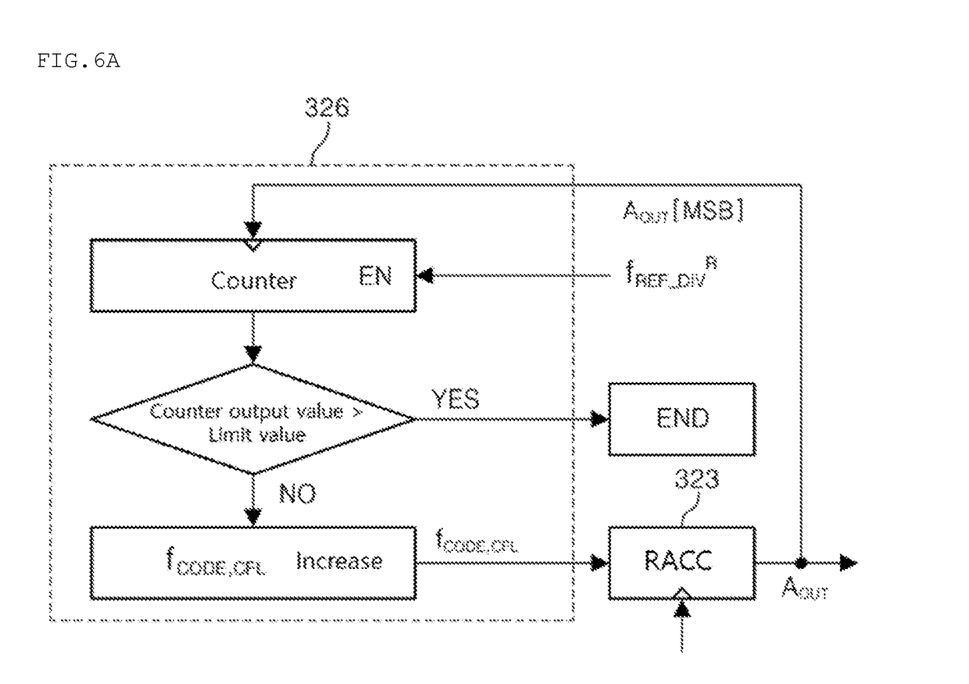
FIG. 6A is a flowchart illustrating the operation principle of a coarse frequency lock.
Figure 6B:
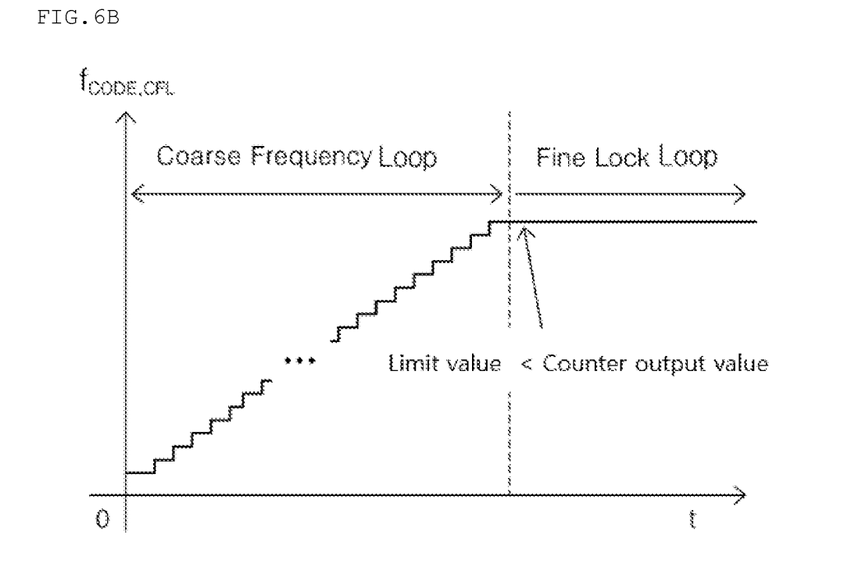
FIG. 6B is a graph illustrating the principle that a coarse lock loop is switched to a fine lock mode.

FIG. 6A is a flowchart illustrating the operation principle that the CFL 326 outputs the second frequency code $f_{CODE,CFL}$, and FIG. 6B is a graph illustrating the principle that the coarse lock mode is switched to the fine lock mode. Referring to FIGS. 6A and 6B, the operation of the coarse lock loop will be described as follows.

The logic circuit enables the counter at each predefined time, i.e. in each 'high' period of a synchronization divided reference clock signal $f_{REF\_DIV}^R$, such that the counter performs a count operation on an edge of the output clock signal $A_{OUT}$[MSB]. Then, the logic circuit compares an output value of the counter to a limit value proportional to N which is a preset integer division value. At this time, when it is determined that the count value is lower than the limit value, the logic circuit increases the second frequency code $f_{CODE,CFL}$ to raise the frequency of the output clock signal $A_{OUT}$[MSB]. However, when it is determined that the count value exceeds the limit value, the logic circuit stops the update operation of the second frequency code $f_{CODE,CFL}$ by stopping the count operation of the counter. Thus, the operation loop is switched from the coarse lock loop to the fine lock loop. Finally, when the coarse lock loop is ended, the CFL 326 retains the offset value referred to as the second frequency code $f_{CODE,CFL}$, and outputs the offset value to the RACC 323.

Through such a process, the CFL 326 generates the second frequency code $f_{CODE,CFL}$ in the coarse lock loop, the second frequency code $f_{CODE,CFL}$ indicating the offset value of the sum frequency code fCODE that decides the initial oscillation frequency of the output clock signal $A_{OUT}$ [MSB] before the PLL 300 operates as the fine lock loop.

After the CFL 326 generates the second frequency code $f_{CODE,CFL}$ for preventing harmonic lock, the fine lock loop constituted by the sampling D flip-flop 321, the DLF 322 and the RACC 323 starts to operate. Then, when the sampling D flip-flop 321 detects a phase error and outputs a phase difference signal $PD_{OUT}$ based on the detected phase error, the DLF 322 generates the remaining value $f_{CODE,DLF}$ except the offset value of the sum frequency code $f_{CODE}$ by filtering the phase difference signal $PD_{OUT}$.

Figure 7A:
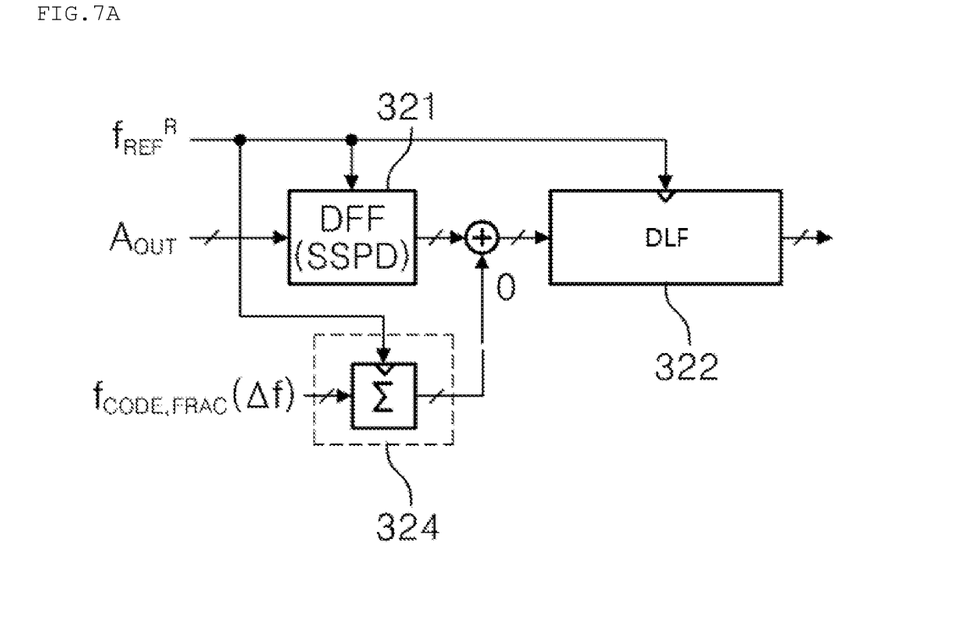
FIG. 7A is a peripheral circuit diagram for describing the operation principle of a fractional accumulator.
Figure 7B:
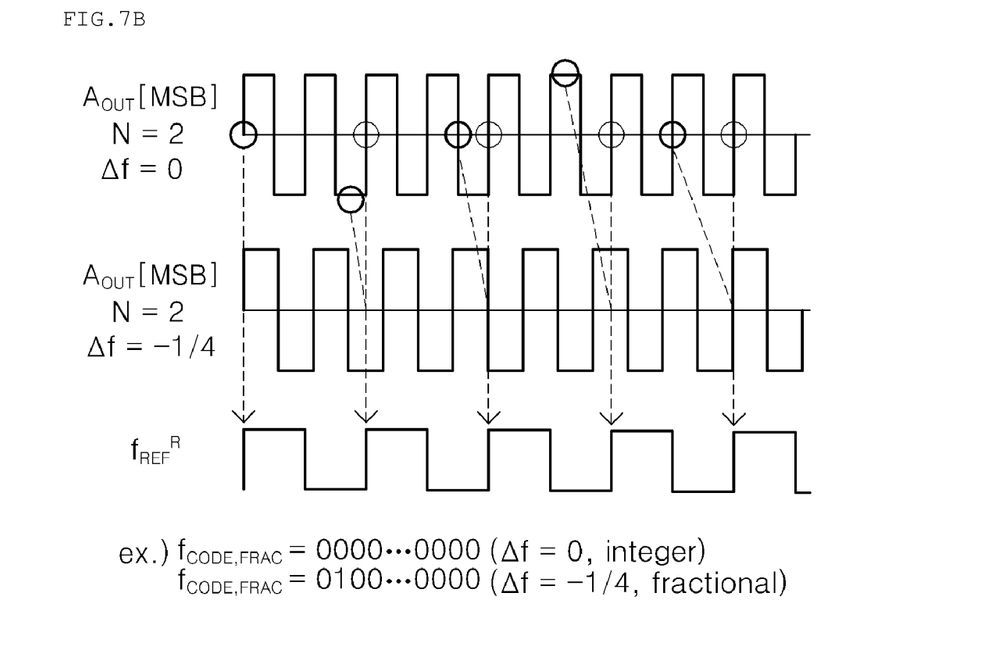
FIG. 7B is a waveform diagram illustrating the operation principle of the fractional accumulator.
Figure 7C:
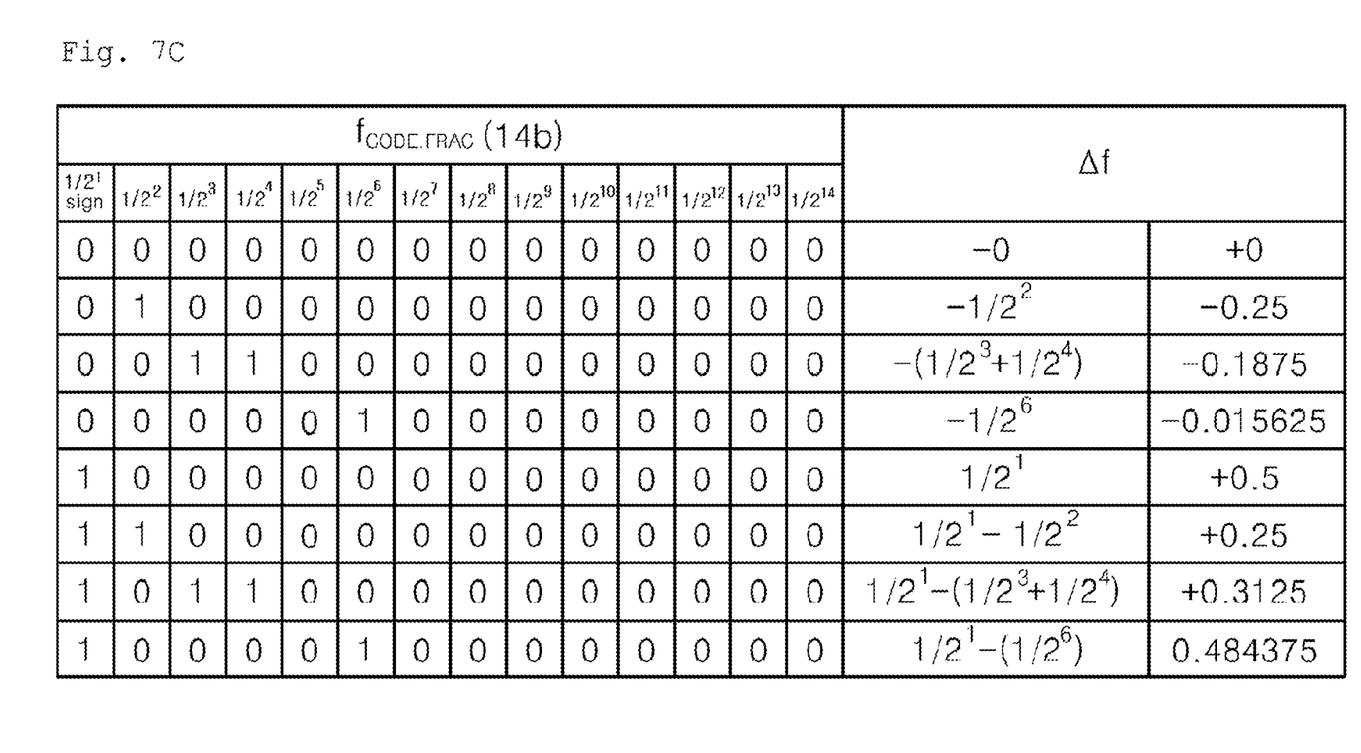
FIG. 7C is a table showing output examples of fractional values based on fractional frequency codes.

The fractional accumulator 324 added to the fine lock loop serves to synthesize a fractional frequency. Referring to FIGS. 7A to 7C, the operation of the fractional accumulator 324 will be described as follows.

When the fractional accumulator 324 operates as an integer-N accumulator, a fractional frequency code $f_{CODE,FRAC}$ Δf inputted to the fractional accumulator 324 is set to 0. When the fractional frequency code $f_{CODE,FRAC}$ is not 0, the fractional accumulator 324 operates as a fractional-N accumulator. The fractional accumulator 324 accumulates the fractional frequency code $f_{CODE,FRAC}$ in each period of the synchronization reference clock signal $f_{REF}^R$. The fractional accumulated value outputted from the accumulator 324 is added to the phase difference signal $PD_{OUT}$, and the resultant signal is supplied as an input value of the DLF 322 and thus compensates for a fractional phase.

For example, when an M-bit fractional frequency code $f_{CODE,FRAC}$ is 0100 . . . 0000 (Δf=-¼), the fractional accumulated value of the fractional accumulator 324 becomes 00 . . . 0, 01 . . . 0, 10 . . . 0 and 11 . . . 0. Such a digital code corresponds to phase information of 0, π/2, π and 3π/2. At this time, the fine lock loop adjusts the sum frequency code $f_{CODE}$ such that an input of the DLF 322 becomes 0. Then, the phase difference signal $PD_{OUT}$ is outputted as 0, -π/2, -π and -3π/2 corresponding to the opposite phase of the above-described digital code.

The fractional accumulator 324 may be used to generate a fractional frequency as described above. FIG. 7C illustrates an output example of a fractional value based on the fractional frequency code $f_{CODE,FRAC}$.

The RACC 323 of the PLDDS 320 is an NCO (Numerical Controlled Oscillator) that generates the output phase signal $A_{OUT}$ as a whole digital signal. The RACC 323 serves to remove nonlinearity which occurs while digital-analog conversion and analog-digital conversion are performed in the PLL 300. The RACC 323 is a direct digital synthesizer that serves to exhibit ideal linearity and reduce in-band fractional spur.

However, when the RACC 323 outputs only the MSB as the output clock signal $A_{OUT}$[MSB], quantization noise has an influence on out-of-band noise. In order to compensate for such noise, the PI 330 is installed at an output terminal of the PLDDS 320.

Figure 8A:
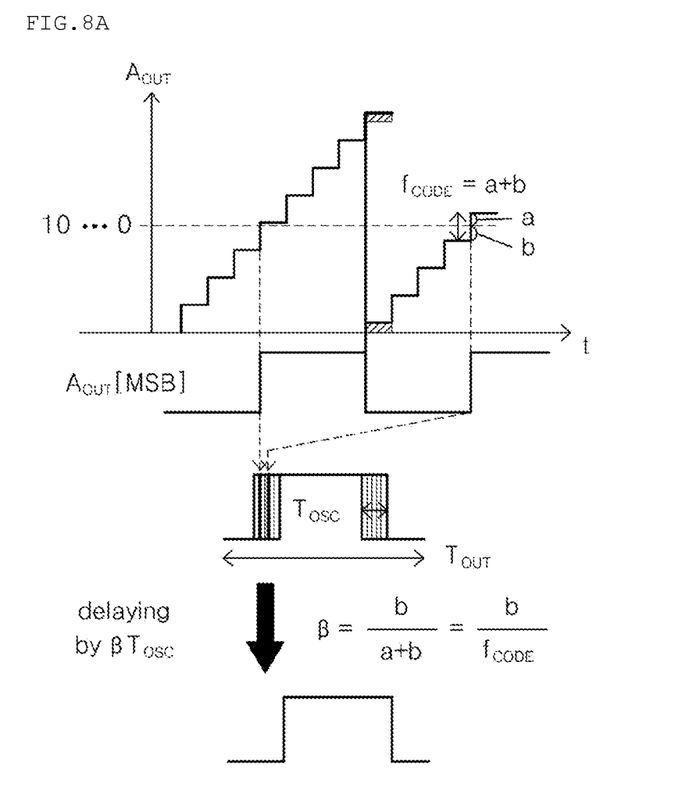
FIG. 8A is a diagram for describing the phase interpolation principle of a phase interpolator.
Figure 8B:
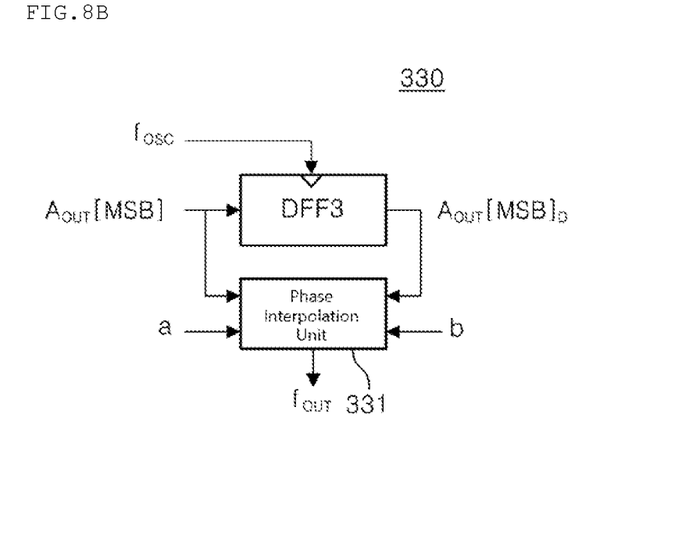
FIG. 8B is a circuit diagram illustrating an implementation example of the phase interpolator.

The PI 330 serves to reduce out-of-band noise by processing the output clock signal $A_{OUT}$[MSB] outputted from the PLDDS 320. FIG. 8A illustrates the principle that the PI 330 performs phase interpolation using the other lower bits LSBs of the output phase signal $A_{OUT}$, and FIG. 8B is a circuit diagram illustrating an implementation example of the PI 330.

The lower bits of the output phase signal $A_{OUT}$ contain fractional phase information of the MSB. The PI 330 uses the MSB output $A_{OUT}[MSB]$ of the output phase signal $A_{OUT}$ and a signal $A_{OUT}[MSB]_D$ obtained by delaying the MSB output $A_{OUT}[MSB]$ by $T_{OSC}$. The interpolation ratio of the two signals (a and b) may be obtained when the output of the MSB transitions from 0 to 1.

Figure 8C:
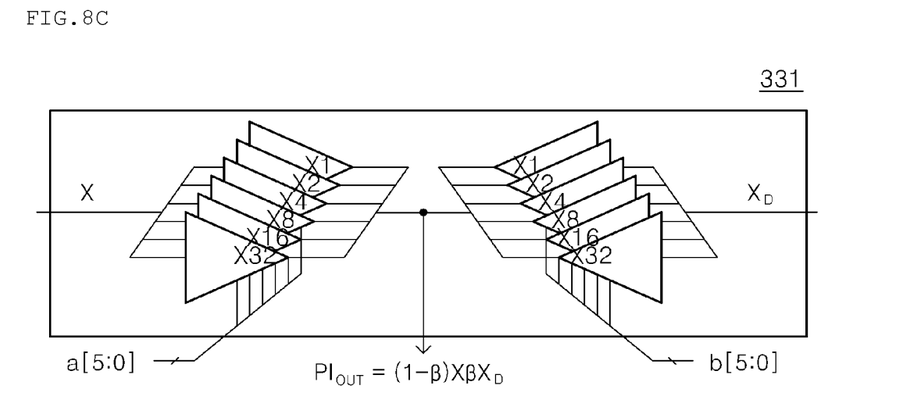
FIG. 8C is a diagram illustrating an example in which a phase interpolation unit is implemented as a tri-state buffer.

FIG. 8C illustrates an example in which a phase interpolation unit 331 is implemented with a tri-state buffer.

The output clock signal $f_{OUT}$ outputted from the PI 330 is expressed as [Equation 1] below.

$$f_{OUT} = \frac{f_{CODE}}{2^M} f_{OSC} = (N + \Delta f) \cdot f_{REF} \quad \text{[Equation 1]}$$

In Equation 1, $f_{CODE}$ represents the sum frequency code, $f_{OSC}$ represents the oscillation signal, M represents the bit number of the RACC, N represents an integer to be divided, $\Delta f$ represents a fraction to be divided, and $f_{REF}$ represents the reference clock signal.

While various embodiments have been described above, it will be understood to those skilled in the art that the embodiments described are by way of example only. Accordingly, the disclosure described herein should not be limited based on the described embodiments.

The invention claimed is:

1. A phase locked loop (PLL) using a phase-locked direct digital synthesizer, comprising:
   a free-running oscillator configured to generate a free-running oscillation signal;
   a phase-locked direct digital synthesizer configured to generate an output clock signal and an output phase signal whose phases are locked, using the free-running oscillation signal; and
   a phase interpolator configured to reduce out-of-band noise by processing the output clock signal,
   wherein the phase-locked direct digital synthesizer comprises:
      a sampling D flip-flop configured to sample the output phase signal with a synchronization reference clock signal, and output a phase difference signal corresponding to a phase difference between the output clock signal and the synchronization reference clock signal;
      a digital loop filter configured to generate a first frequency code for adjusting a frequency of the output clock signal by filtering the phase difference signal;
      a rotational accumulator configured to accumulate a sum frequency code in each period of the free-running oscillation signal through a modulus method, the sum frequency code corresponding to a sum of the first frequency code and a second frequency code, and output a most significant bit (MSB) of an accumulated output value as the output clock signal;
      a retimer configured to generate the synchronization reference clock signal synchronized with the free-running oscillation signal by sampling a reference clock signal with the free-running oscillation signal; and
      a coarse frequency lock configured to generate the second frequency code and output the second frequency code to an input side of the rotational accumulator, in order to prevent harmonic lock which occurs when the output clock signal is sub-sampled, and wherein the coarse frequency lock is configured to generate an offset value of the sum frequency code that decides an initial frequency of the output clock signal before the PLL operates as a fine lock loop.

2. The PLL of claim 1, wherein the digital loop filter is configured to generate the first frequency code by filtering the phase difference signal when the phase difference signal is outputted from the sampling D flip-flop.

3. The PLL of claim 1, wherein the phase-locked direct digital synthesizer comprises a fractional accumulator configured to accumulate a fractional frequency code in each period of the synchronization reference clock signal, and compensate for the phase difference signal with a fractional accumulated value.

4. The PLL of claim 1, wherein the sampling D flip-flop and the rotational accumulator are configured to serve to remove nonlinearity which occurs while digital-analog conversion and analog-digital conversion are performed in the PLL.

5. The PLL of claim 1, wherein the rotational accumulator is configured to continuously accumulate an input value through the modulus method even though the accumulated output value exceeds a preset maximum value.

6. The PLL of claim 1, wherein the retimer is configured to generate the synchronization reference clock signal using a D flip-flop.

7. The PLL of claim 1, wherein the output clock signal outputted from the phase interpolator is expressed as the following equation:

$$f_{OUT} = \frac{f_{CODE}}{2^M} f_{OSC} = (N + \Delta f) \cdot f_{REF}$$

where $f_{CODE}$ represents the sum frequency code, $f_{OSC}$ represents the free-running oscillation signal, M represents a bit number of the rotational accumulator (RACC), N represents an integer to be divided, $\Delta f$ represents a fraction to be divided, and $f_{REF}$ represents the reference clock signal.

8. The PLL of claim 1, wherein the retimer comprises a D flip-flop configured to generate the synchronization reference clock signal synchronized with the free-running oscillation signal by sampling a reference clock signal with the free-running oscillation signal, in order to synchronize the free-running oscillation signal and the synchronization reference clock signal, which have independent frequencies, as one clock signal.

9. A phase locked loop (PLL) using a phase-locked direct digital synthesizer, comprising:
   a free-running oscillator configured to generate a free-running oscillation signal;
   a phase-locked direct digital synthesizer configured to generate an output clock signal and an output phase signal whose phases are locked, using the free-running oscillation signal; and
   a phase interpolator configured to reduce out-of-band noise by processing the output clock signal,
   wherein the phase-locked direct digital synthesizer comprises:
      a sampling D flip-flop configured to sample the output phase signal with a synchronization reference clock signal, and output a phase difference signal corresponding to a phase difference between the output clock signal and the synchronization reference clock signal;

a digital loop filter configured to generate a first frequency code for adjusting a frequency of the output clock signal by filtering the phase difference signal;

a rotational accumulator configured to accumulate a sum frequency code in each period of the free-running oscillation signal through a modulus method, the sum frequency code corresponding to a sum of the first frequency code and a second frequency code, and output a most significant bit (MSB) of an accumulated output value as the output clock signal;

a retimer configured to generate the synchronization reference clock signal synchronized with the free-running oscillation signal by sampling a reference clock signal with the free-running oscillation signal; and a coarse frequency lock configured to generate the second frequency code and output the second frequency code to an input side of the rotational accumulator, in order to prevent harmonic lock which occurs when the output clock signal is sub-sampled, wherein the sampling D flip-flop, the digital loop filter and the rotational accumulator form a fine lock loop, wherein the coarse frequency lock and the rotational accumulator form a coarse lock loop, and wherein the fine lock loop is configured to start an operation after the coarse frequency lock generates an offset value of the sum frequency code.

10. A phase locked loop (PLL) using a phase-locked direct digital synthesizer, comprising:

a free-running oscillator configured to generate a free-running oscillation signal;

a phase-locked direct digital synthesizer configured to generate an output clock signal and an output phase signal whose phases are locked, using the free-running oscillation signal; and a phase interpolator configured to reduce out-of-band noise by processing the output clock signal, wherein the phase-locked direct digital synthesizer comprises:

a sampling D flip-flop configured to sample the output phase signal with a synchronization reference clock signal, and output a phase difference signal corresponding to a phase difference between the output clock signal and the synchronization reference clock signal;

a digital loop filter configured to generate a first frequency code for adjusting a frequency of the output clock signal by filtering the phase difference signal;

a rotational accumulator configured to accumulate a sum frequency code in each period of the free-running oscillation signal through a modulus method, the sum frequency code corresponding to a sum of the first frequency code and a second frequency code, and output a most significant bit (MSB) of an accumulated output value as the output clock signal;

a retimer configured to generate the synchronization reference clock signal synchronized with the free-running oscillation signal by sampling a reference clock signal with the free-running oscillation signal; and a coarse frequency lock configured to generate the second frequency code and output the second frequency code to an input side of the rotational accumulator, in order to prevent harmonic lock which occurs when the output clock signal is sub-sampled, and wherein the phase interpolator is configured to perform phase interpolation using lower bits of the output phase signal.

* * * * *